(12) United States Patent
Eckstein et al.

(10) Patent No.: US 7,168,150 B2
(45) Date of Patent: Jan. 30, 2007

(54) METHOD OF MAKING A RESONANT FREQUENCY TAG

(75) Inventors: Eric Eckstein, Merion Station, PA (US); Gary Mazoki, Sewell, NJ (US); Peter Lendering, Terborg (NL); Luis Francisco Soler Bonnin, Guanica, PR (US); Takeshi Matsumoto, Kanagawa-ken (JP); Lawrence Appalucci, Villanova, PA (US)

(73) Assignee: Checkpoint Systems, Inc., Thorofare, NJ (US)

( * ) Notice: Subject to any disclaimer, the term of this patent is extended or adjusted under 35 U.S.C. 154(b) by 225 days.

(21) Appl. No.: 10/967,947

(22) Filed: Oct. 19, 2004

(65) Prior Publication Data
US 2005/0077076 A1   Apr. 14, 2005

Related U.S. Application Data

(62) Division of application No. 10/388,344, filed on Mar. 13, 2003, now Pat. No. 6,925,701.

(51) Int. Cl.
*G01R 31/28* (2006.01)

(52) U.S. Cl. .................. 29/593; 29/25.42; 29/592.1; 29/602.1; 29/605; 29/606; 29/831; 29/832; 174/260; 174/261; 324/633; 324/652; 324/655; 324/656; 336/176; 336/200; 336/229; 340/572.1; 340/572.2; 361/737; 361/760; 361/765; 361/766; 427/79; 427/80

(58) Field of Classification Search ............. 29/25.42, 29/592.1, 593, 602.1, 605, 606, 831, 832, 29/842, 846, 850; 174/260, 261; 324/633, 324/652, 655, 656; 336/176, 200, 229; 427/79, 427/80; 340/572.1, 572.2; 361/737, 760, 361/765, 766
See application file for complete search history.

(56) References Cited

U.S. PATENT DOCUMENTS

| 3,863,244 A | 1/1975 | Lichtblau |
| 3,913,219 A | 10/1975 | Lichtblau |

(Continued)

FOREIGN PATENT DOCUMENTS

| EP | 380426 | 1/1990 |
| EP | 470318 | 2/1992 |

(Continued)

OTHER PUBLICATIONS

"Magnetic Arrays and Their Resonant Frequencies for the Production of Binary Codes", Schrott, A.G., von Gutfeld, R.J., IEEE Transactions on Magnetics, vol. 34, Issue: 5, Sep. 1998, pp. 3765-3771.

(Continued)

*Primary Examiner*—Paul D. Kim
(74) *Attorney, Agent, or Firm*—Caesar, Rivise, Bernstein, Cohen & Pokotilow, Ltd.

(57) ABSTRACT

A method of making a resonant frequency tag which resonates at a predetermined frequency. The method involves providing a first conductive pattern having an inductive element and a first land and a second conductive pattern having a second land and a third land which are joined together by a link. The second conductive pattern is overlaid the first conductive pattern such that the second land is positioned over the first land. The third land is in electrical communication with the inductive element of the first conductive pattern. The formed resonant frequency tag is energized to determine if the tag resonates at the predetermined frequency. If the tag resonates properly, the third land is electrically coupled to the inductive element. If it does not, the second conductive pattern is adjusted so that overlapping portions of the first and second lands are changed, altering the capacitance to adjust the resonant tag frequency.

18 Claims, 6 Drawing Sheets

U.S. PATENT DOCUMENTS

| | | | |
|---|---|---|---|
| 4,369,557 A | | 1/1983 | Vandebult et al. |
| 4,792,790 A | | 12/1988 | Reeb et al. |
| 4,818,312 A | | 4/1989 | Benge |
| 5,182,544 A | * | 1/1993 | Aquilera et al. ......... 340/572.5 |
| 5,276,431 A | | 1/1994 | Piccoli et al. |
| 5,381,137 A | | 1/1995 | Ghaem et al. |
| 5,444,223 A | | 8/1995 | Blama |
| 5,754,110 A | | 5/1998 | Appalucci et al. |
| 5,841,350 A | * | 11/1998 | Appalucci et al. ....... 340/572.3 |
| 5,861,809 A | * | 1/1999 | Eckstein et al. ......... 340/572.3 |
| 6,087,940 A | | 7/2000 | Caperna et al. |
| 6,133,834 A | | 10/2000 | Eberth et al. |
| 6,400,271 B1 | * | 6/2002 | Davies et al. ............ 340/572.1 |

FOREIGN PATENT DOCUMENTS

| | | |
|---|---|---|
| GB | 1476885 | 6/1977 |
| JP | 2002270916 A | 9/2002 |
| JP | 2002259926 A | 1/2003 |
| WO | 00/79497 | 12/2000 |
| WO | 0141059 | 6/2001 |

OTHER PUBLICATIONS

European Search Report dated Mar. 6, 2006 for European Application No. EP 0 470 4904.

"Magnetic Arrays and Their Resonant Frequencies for the Production of Binary Codes"; Schrott, A.G.; Von Gutfeld, R.J.; Magnetics, IEEE Transactions on vol. 34, Issue 5, Part 2; Sep. 1998; pp. 3765-3771.

Supplemental European Search Report dated Aug. 4, 2006 for European Application No. EP 0 470 4904.

* cited by examiner

METHOD OF MAKING A RESONANT FREQUENCY TAG

This application is a divisional application of application Ser. No. 10/388,344 filed on Mar. 13, 2003, now U.S. Pat. No. 6,925,701, entitled RESONANT FREQUENCY TAG AND METHOD FOR CONTROLLING TAG FREQUENCY, and whose entire disclosure is incorporated by reference herein.

BACKGROUND OF THE INVENTION

The present invention relates generally to resonant frequency tags and, more particularly, to a method for making such resonant frequency tags to provide for improved control of the resonant frequency of such tags.

Resonant frequency tags are tags which include a passive electrically resonant frequency circuit which resonates at a predetermined frequency when stimulated by a radio frequency electromagnetic field at about the resonant frequency of the tag and which is incident upon the tag. A resonant frequency circuit resonating within a region occupied by such an electromagnetic field perturbs the electromagnetic field. The perturbation of the electromagnetic field is detectable by suitable equipment. Consequently, the presence of a passive resonant frequency tag within a prescribed region may be detected.

Typically, resonant frequency tags are attached to or embedded within goods sold at retail or to the packaging for such goods in order to deter or detect theft. Resonant frequency tags used for this purpose are capable of being removed from the goods or deactivated when a legitimate sale is consummated. Resonant frequency tags which are not removed or deactivated at the point of sale may be detected by suitable detection apparatus generally placed at points of exit from a retail or other establishment. Such resonant frequency tags may have other uses including for identification or information purposes, such as a radio frequency identification (RFID) tag which may or may not include an integrated circuit or chip.

Typically, a resonant frequency tag comprises a generally flat thin laminate of a dielectric layer separating two conductor layers. Typically, one of the conductor layers comprises a flat spiral conductor (coil) forming an inductor, and a land forming one plate of a capacitor which is connected to a proximate end of the coil. A second land forming a second plate of the capacitor is formed as the second conductor layer. A through connection between the second plate and a distal end of the coil completes the resonant frequency circuit comprising the coil inductor connected parallel with the capacitor.

It is required that the inductive and capacitive elements of resonant frequency tags be manufactured with some precision in order that the resonant frequency of the tags be held within prescribed limits of the detection apparatus. A generally used method for making resonant tags employs etching a metallic foil to form the components of the conductive layers.

The manufacturing techniques employed in producing the prior art and current resonant frequency tags results in some unwanted variability in the final tag frequency. The unwanted variability is generally the result of small changes in the value of the capacitive element which vary from resonant circuit to resonant circuit during the production process. Such variations in the value of the capacitive element may be due to several factors, including irregularities in the dielectric area between the plates of the capacitor. The present invention comprises a method for compensating for variations in the manufacturing process to produce resonant frequency tags with a more consistent resonant frequency.

BRIEF SUMMARY OF THE INVENTION

Briefly stated, in one embodiment, the present invention comprises a method of making a resonant frequency tag which resonates at a predetermined frequency. The method comprises the steps of forming a first conductive pattern comprising an inductive element and a first conductive land, the first land having a first end connected to one end of the inductive element, and a second end spaced a predetermined distance from the first end; separately forming a second conductive pattern comprising a second land and a link element, the second land having a predetermined width; placing the second conductive pattern proximate to the first conductive pattern at a first predetermined location so that the second land overlies at least a portion of the first land with a dielectric therebetween to establish the plates of a capacitive element with a first predetermined capacitance which with the inductive element forms a resonant circuit; measuring the resonant frequency of the resonant circuit and comparing the measured frequency with the predetermined frequency; if the resonant frequency does not match the predetermined frequency within a selected tolerance, moving the second conductive pattern so that the second land moves along the length of the first land to thereby change the capacitance of the capacitive element; repeating the last two steps until a match occurs; and securing the second conductive pattern to the first conductive pattern.

In another embodiment, the present invention comprises a method of making a series of resonant frequency tags which each resonate at a predetermined frequency, the method comprising the steps of forming a series of first conductive patterns, the first conductive patterns all being substantially the same, each first conductive pattern comprising an inductive element and a first conductive land, the first land having a first end connected to one end of the inductive element and a second end spaced a predetermined distance from the first end; separately forming a series of second conductive patterns, the second conductive patterns all being substantially the same and each second conductive pattern comprising a second conductive land and a link element, the second land having a predetermined width; securing a second conductive pattern to a first conductive pattern of the series at a first predetermined location so that the second land overlies at least a portion of the first land with a dielectric therebetween to establish the plates of a capacitive element of a first tag of the series, the capacitive element having a first predetermined capacitance; measuring the resonant frequency of the tag and comparing the measured frequency with the predetermined frequency; if the measured resonant frequency matches the predetermined frequency within a predetermined tolerance, securing a second conductive pattern to a subsequent first conductive pattern of the series at the first predetermined location so that the second land overlies at least a portion of the first land with a dielectric therebetween to establish the plates of a capacitive element of a subsequent tag, the capacitive element having the first predetermined capacitance and then repeating the prior and present steps for the remainder of the series and if the measured resonant frequency does not match the predetermined frequency within the predetermined tolerance, securing a second conductive pattern to the second surface of a subsequent first conductive pattern of the series at a second predetermined location, different from the first predetermined location so that the second land overlies at least a portion of the first land with a dielectric therebetween to establish the plates of a capacitive element of a subsequent tag, the capacitive element having a second predetermined capacitance and then repeating the prior and present steps for the remainder of the series.

In another embodiment, the present invention comprises a method of making a series of N resonant frequency tags with N being an integer greater than 1. Each of the N tags has a resonant frequency which differs from the resonant frequency of every other tag in the series by at least a predetermined minimum frequency range. The method comprises the steps of forming N first conductive patterns, the first conductive patterns all being substantially the same and each first conductive pattern comprising an inductive element and a first conductive land with a first end of the first conductive land being connected to one end of the inductive element and a second end of the first conductive land being spaced from the first end by a predetermined distance; separately forming N second conductive patterns, the second conductive patterns all being substantially the same and each second conductive pattern comprising a second land and a link element, the second land having a predetermined width; and sequentially securing a second conductive pattern to each of the first conductive patterns at a location so that the second land of each second conductive pattern overlies a portion of the first land of the corresponding first conductive pattern with a dielectric therebetween to establish the plates of a capacitive element for each resonant frequency tag, the location of each second conductive pattern relative to the first conductive land of a corresponding first conductive pattern and thus the amount by which each second land overlies the first land being different for each resonant frequency tag of the series so that the capacitance of the capacitive element of each resonant frequency tag is different from the capacitance of the capacitive element of every other resonant frequency tag of the series by at least a minimum value to thereby cause each resonant frequency tag to resonate at a different frequency from every other resonant frequency tag of the series.

BRIEF DESCRIPTION OF THE SEVERAL VIEWS OF THE DRAWINGS

The foregoing summary, as well as the following detailed description of preferred embodiments of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 1:
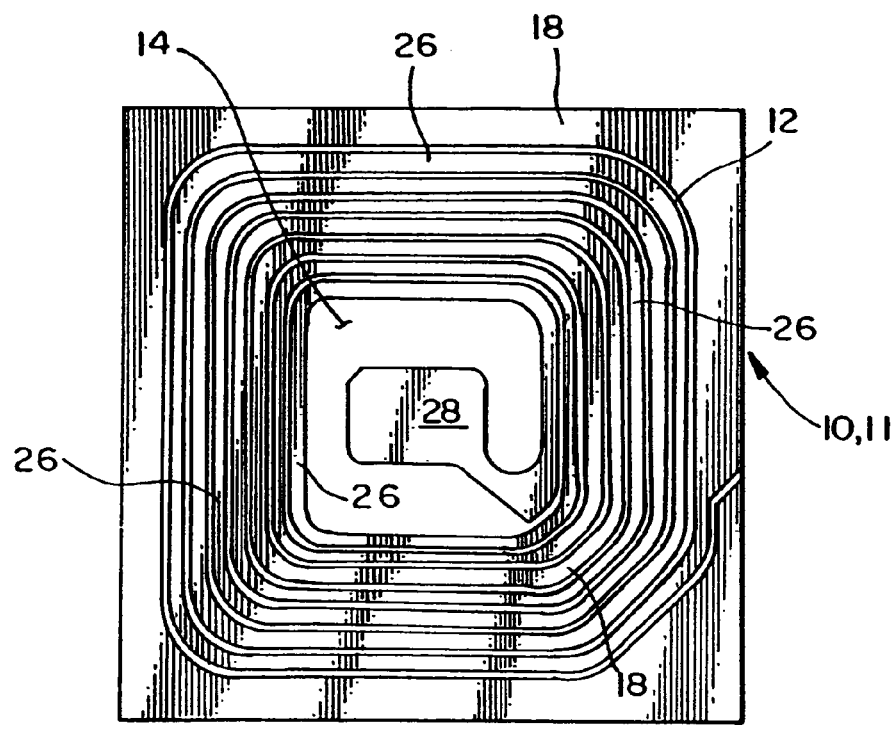
FIG. 1 is a top plan view of a first principal surface of a typical prior art resonant frequency tag.
Figure 2:
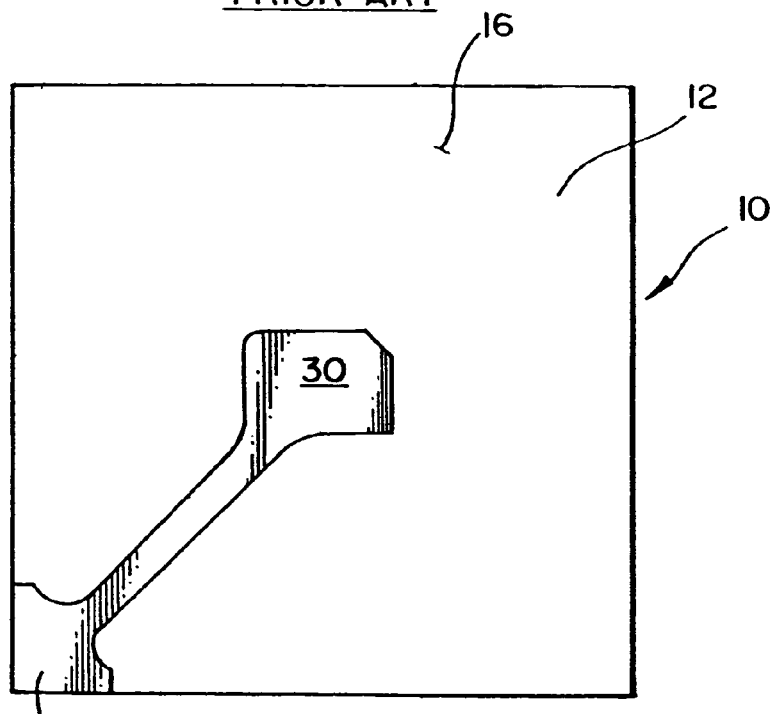
FIG. 2 is a bottom plan view showing the second, opposite principal surface of the resonant frequency tag shown in FIG. 1.

Referring now to the drawings wherein the same reference numeral designations are applied to corresponding elements throughout the several figures, there is shown in FIGS. 1 and 2 a typical resonant frequency tag or tag 10 of a type for use with an electronic article security system (not shown). The tag 10 is generally of a type which is well known in the art of electronic article security systems, having two operational states: (1) an active state in which the tag 10 is detectable by an electronic article security system and (2) an inactive state in which the tag 10 is not normally detectable by an electronic article security system. As is well known in the art, the tag 10 is adapted to be secured to or otherwise borne by or within an item or article, or the packaging of such article for which security or surveillance is sought. The tag 10 may be secured to the article or its packaging at a retail or other such facility, or as is presently preferred, secured or incorporated into the article or its packaging by a manufacturer or wholesaler of the article.

The tag 10 is employed in connection with an electronic article security system (not shown), particularly an electronic article security system of the radio frequency or IF type such as exemplified by U.S. Pat. No. 3,863,244 entitled "Electronic Security System Having Improved Noise Discrimination" which is incorporated herein by reference. Such electronic article security systems are well known in the art and therefore, a complete description of the structure and operation of such electronic article security systems is not necessary for an understanding of the present invention. Suffice it to say that such electronic article security systems establish a surveillance or detection zone, generally proximate to an entrance or exit of a facility, such as a retail store. The function of the security system is to detect the presence within the detection zone of an article having an active tag 10 secured thereto or secured to the article's packaging.

The security tag 10 includes components (hereinafter described in greater detail) which establish a resonant circuit 11 which resonates when exposed to radio frequency IF energy at or near a predetermined detection resonant frequency of the resonant circuit 11. A typical electronic article security system employing the tag 10 includes means for transmitting IF energy of a frequency at or near the resonant frequency of the security tag 10 into or through the detection zone and means for detecting an IF field disturbance that is caused by the presence of the security tag 10 resonant circuit 11 in the detection zone to establish the presence of the security tag 10 and thus a protected article, within the detection zone.

The typical tag 10, shown in FIGS. 1 and 2, comprises a generally rectangular, planar insulative or dielectric substrate 12 having first and second opposite principal surfaces 14, 16. The substrate material may be any solid material or composite structure of material so long as it is insulative and can be used as a dielectric. Preferably the substrate 12 is formed of an insulated dielectric material of a type well known in the art, for example, a polymeric material such as polyethylene. However, it will be recognized by those skilled in the art that other dielectric materials may alternatively be employed in forming the substrate 12.

The tag 10 further comprises circuitry located on the substrate 12 for establishing at least one resonant circuit 11 by forming predetermined circuit elements or components on both principal surfaces 14, 16 of the substrate 12 which will be hereinafter described. The circuit elements are formed by a combination of a first conductive pattern 18 imposed on the first principal surface 14 of the substrate 12 best seen in FIG. 1, which surface is arbitrarily selected as the top surface of the tag 10, and a second conductive pattern 20 imposed on the opposite side or second principal surface 16 of the substrate 12 (best seen in FIG. 2).

The conductive patterns 18, 20 are formed on the substrate surfaces 14, 16, respectively, with electrically conductive materials of a known type and in a manner which is well known in the electronic article surveillance art. In one known embodiment, the conductive material is patterned by a subtractive process (i.e. etching), whereby unwanted conductive material is removed by chemical attack after the desired conductive material for forming the conductive patterns 18, 20 has been protected, typically with a printed-on etch resistant ink. A suitable method for forming such conductive patterns is described in detail in U.S. Pat. No. 3,913,219 entitled "Planar Circuit Fabrication Process" which is incorporated by reference. The conductive material is preferably aluminum. However, other conductive materials (e.g., gold, nickel, copper, phosphor bronzes, brasses, solders, high density graphite, aluminum filled conductive epoxies or silver-filled conductive epoxies) can be substituted for aluminum without changing the nature of the resonant circuit 11 or its operation. It will be appreciated by those skilled in the art that other suitable electrically conductive materials and/or fabrication methods could alternatively be employed.

The first and second conductive patterns 18, 20 establish a resonant circuit 11 having a resonant frequency within the detection range of the electronic article security system with which the tag 10 is employed. In the case of the tag 10, the resonant circuit 11 is comprised of a single inductor or inductive element which is electrically connected in parallel with a single capacitor or capacitive element. As best shown in FIG. 1 the inductive element comprises an inductive coil 26 formed as part of the first conductive pattern 18. However, it will be recognized that the inductive coil 26 could be formed as part of the second conductive pattern 20, or could be formed as part of both conductive patterns 18, 20. Alternatively, there could be two or more inductive coils formed within the first and/or second conductive patterns 18,20. Further, the conductive patterns 18,20 need not form an inductive coil 26 but, for instance, could establish an inductive reactance from the formation of an electrical transmission line constructed by strip line or microstrip methods and be within the spirit and scope of the invention.

The resonant circuit of tag 10 further includes a capacitive element having a first plate formed by a first generally rectangular land portion 28 of the first conductive pattern 18, as shown in FIG. 1, and a second plate formed by a second generally rectangular land portion 30 of the second conductive pattern 20 as shown in FIG. 2. The conductive land portions or plates 28, 30 are aligned so as to overly each other and are separated by the dielectric substrate 12 to form the capacitive element.

Referring now to FIGS. 1 and 2 the resonant circuit 11 is formed by the combination, in a series loop, of the inductive coil 26 electrically connected on one end to the generally rectangular land portion 28 of the first conductive pattern 18 and on the other end to the generally aligned rectangular land portion 30 of the second conductive pattern 20, by a link (not shown) which passes through the dielectric substrate 12 to electrically connect the conductive patterns 18,20. Although the illustrated embodiment of the tag 10 includes a single capacitor formed by the land portions 28, 30, two or more capacitor elements could alternately be employed and still be within the spirit and scope of the invention.

The tag 10 as thus far described is typical of prior art security tags which are well known in the electronic security and surveillance art and have been in general usage. In forming such security tags, the area of the inductive coil 26 and the areas of the overlap of the capacitor plates 28, 30 are carefully selected so that the resonant circuit 11 formed thereby has a predetermined resonant frequency which generally corresponds to or approximates a detection frequency employed in an electronic article security system for which the tag 10 is designed to be employed. In the illustrated embodiment, the tag 10 resonates at or near 8.2 megahertz (MHz) which is a frequency commonly employed by electronic article security systems from a number of manufacturers. However, this specific frequency is not to be considered a limitation of the present invention.

The resonant frequency tag 10 as shown and described is generally adequate for its intended purposes. However, because of the manufacturing techniques used for making the tag 10, it is not unusual for the resonant frequency of at least a portion of the tags which are produced to vary from the desired resonant frequency. Such variations in the resonant frequency of a tag 10 may be due to variations in the thickness of the dielectric between the two capacitor plates 28, 30, slight misalignments in the capacitor plates, 28, 30 and other factors. As a result, in order to make sure that any tag 10 having a resonant frequency at or near the desired resonant frequency is detected when passing through the surveillance zone of a detection system, it is necessary to vary the frequency employed by the detection system at least within a prescribed range both above and below the desired resonant frequency. For example, if the desired resonant frequency is 8.2 MHz, the detection system must be operational for frequencies between about 7.6 MHz and about 9.0 MHz. Producing detection systems which function within such a detection frequency range is less efficient than detection systems which operate in a much smaller detection frequency range.

Figure 3:
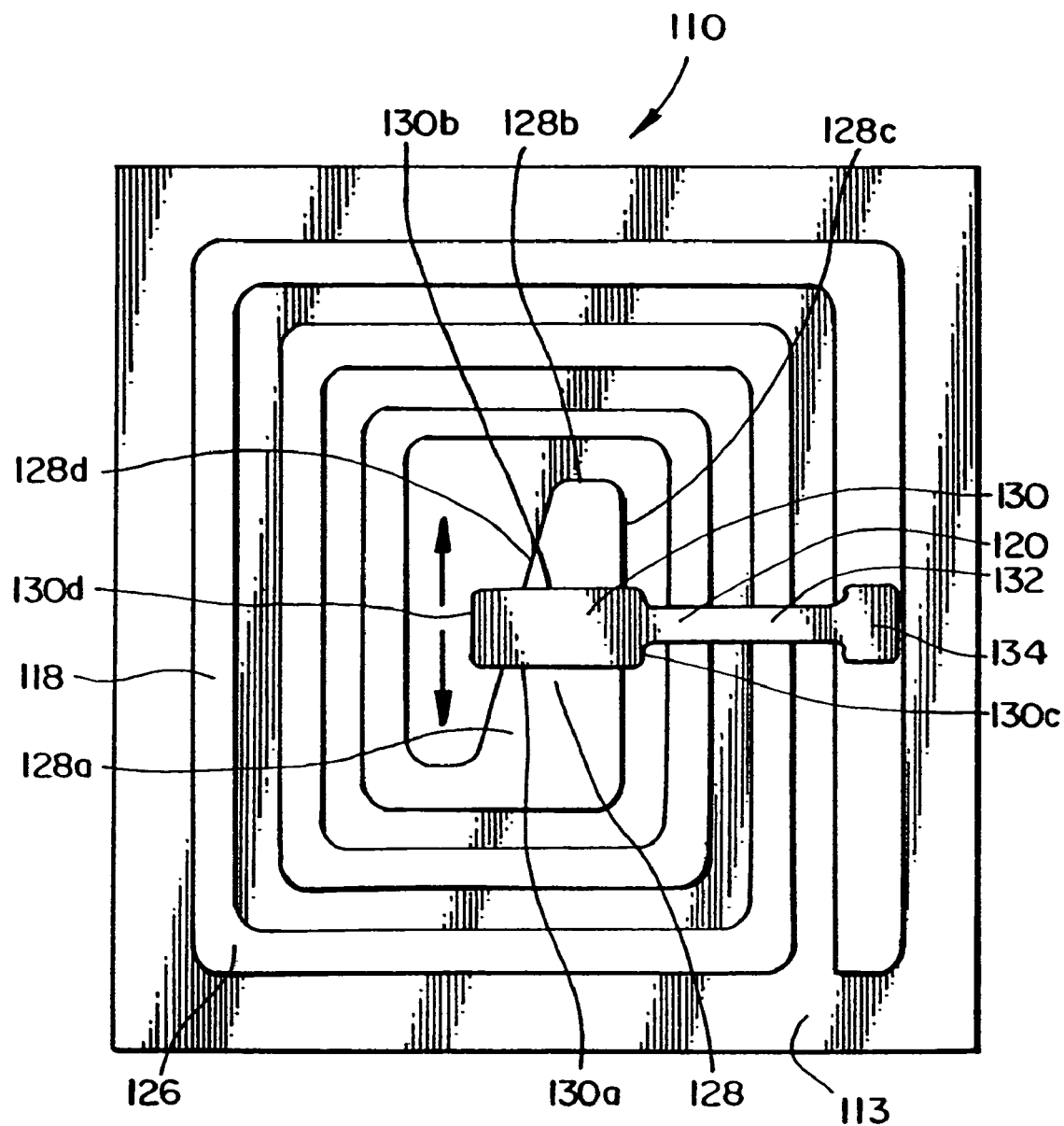
FIG. 3 is a top plan view of a resonant frequency tag produced in accordance with the present invention.

The present invention overcomes the problems associated with such variations in the resonant frequency of the prior art resonant frequency tag 10 by employing a different manufacturing process or method to more precisely control the positioning of the second capacitor plate relative to the first capacitor plate to thereby more tightly control the capacitance of the capacitor and to thereby more tightly control the resonant frequency of the tag. FIG. 3 is a schematic representation of a resonant frequency tag 110 in accordance with a preferred embodiment of the present invention. The resonant frequency tag 110, like the tag 10 as described above, includes at least one inductive component and at least one capacitive component connected in parallel to form a resonant circuit having substantially the same characteristics as the resonant circuit 11 as described above.

Like the tag 10 of FIGS. 1 and 2, the tag 110 of FIG. 3 is formed by a combination of a first conductive pattern 118 and a second conductive pattern 120 with a dielectric therebetween. The first conductive pattern 118 may be formed using a subtractive process (i.e., etching) as described above in connection with tag 10 by die cutting, an additive or conductive ink process or any other suitable technique. As with the prior art tag 10 the conductive material employed in forming both the first and second conductive patterns 118, 120 is preferably aluminum. However, other conductive materials could alternatively be employed. As with the prior art tag 10, the first conductive pattern 118 is comprised of an inductive coil 126 and a first capacitor plate formed by part of a first conductive land 128. As best shown in FIG. 3, the land 128 includes a first or proximate end 128a which is electrically connected to one end of the inductive coil 126 and a second or distal end 128b. The first and second ends 128a and 128b of land 128 are separated by a predetermined distance which establishes the length of the land 128. In the illustrated embodiment, the land 128 further includes first and second lateral sides 128c and 128d extending between the first and second ends 128a and 128b. The first side 128c is generally straight and generally parallel to a portion of the inductive coil 126. The second side 128d extends at an angle so as to not be parallel to the first side 128c. In this manner, the width of the land 128 (i.e. the distance between the first and second sides 128c, 128d) decreases or tapers when moving along the length from the first end 128a to the second end 128b. In all other respects, the first conductive pattern 118 is substantially the same as the first conductive pattern 18 of the above-described prior art tag 10. Preferably, the first conductive pattern is at least initially supported by a carrier sheet 113 which may be paper or the like.

A second principal distinction between the present tag 110 and the prior art tag 10 lies in the structure of the second conductive pattern 120 and the manner in which the second conductive pattern 120 is secured to the first conductive pattern 118. As best shown in FIG. 3, the second conductive pattern 120 comprises a generally symmetrical and preferably rectangularly shaped second conductive land 130 a portion of which forms the second capacitor plate. The land 130 is generally rectangular and symmetrical including generally parallel first and second lateral sides 130a and 130b and generally parallel first and second ends 130c and 130d. The first end 130c is electrically connected to a generally elongated conductive link 132 which terminates in a further generally rectangular conductive land 134. Unlike the prior art tag 10, the second conductive pattern 120 of the present embodiment is preferably formed separately and apart from the first conductive pattern 118. The second conductive pattern 120 may be formed using a subtractive or etching process, an additive or conductive ink process, a die cut process or in any other manner which is known or becomes known to those of ordinary skill in the art. The second conductive pattern 120 may include a dielectric layer (not shown) or, if desired, a separate dielectric layer or film may be placed between the second conductive pattern 120 and the first conductive pattern 118 before they are secured together. Alternatively, the first conductive pattern 118 may include a dielectric layer, at least in the area of the first conductive land 128.

Once the second conductive pattern 120 has been separately formed, it is carried on a carrier sheet or substrate 216 (shown on FIG. 4) so that it can be placed on the first conductive pattern 118 at a location such that at least a portion of the second land 130 overlies at least a portion of the first land 128 (with the dielectric therebetween), the overlying portions establishing capacitor plates to form a capacitor having the correct capacitance for establishing a resonant circuit having a frequency which is the precise predetermined resonant frequency or is within a very tight tolerance of the predetermined resonant frequency. Preferably, when the second conductive pattern 120 is located at the correct position with the second land 130 overlying at least a portion of the first land 128 to form the correct capacitance, the second conductive pattern 120 is secured to the first conductive pattern 118 using an adhesive (which may be the dielectric layer), hot pressing (heat and pressure) or some other suitable technique. As will be appreciated when viewing FIG. 3, the area of overlap of land 128 and land 130 may be altered, preferably before the second conductive pattern 120 is secured to the first conductive pattern 118 by simply moving or sliding the second land 130 (second conductive pattern 120) along the length of the first land 128 generally parallel to the first side 128c. Moving land 130 toward the second end 128b of land 128 decreases the area of overlap of lands 128, 130 to thereby effectively decrease the size of the capacitor plates and the capacitance of the resulting capacitive element. Correspondingly, moving land 130 toward the first end 128a of land 128 increases the area of overlap between the two lands 128, 130 to thereby effectively increase the size of the capacitor plates and the capacitance of the capacitive element. As is well known to those of ordinary skill in the art, the resonant frequency of a resonant circuit is established by the value of the inductance and the value of the capacitance in accordance with a predetermined formula $$F = \frac{1}{2\pi\sqrt{L \cdot C}}$$

Increasing the capacitance of a resonant circuit while keeping the inductance constant decreases the frequency and decreasing the capacitance while keeping the inductance constant increases the resonant frequency. By precisely selecting the bonding location of the second conductive pattern 120 on the first conductive pattern 118, the resonant frequency of the resonant circuit may be precisely controlled or tuned to correspond to a predetermined target resonant frequency within a very tight tolerance.

Once the position of the second conductive pattern 120 has been established and the second conductive pattern 120 has been secured to the first conductive pattern 118, the resonant circuit is completed by establishing a conductive link (not shown), typically referred to as a weld through, which passed through the dielectric to electrically connect together the conductive land 134 on the distal end of the second conductive pattern 120 with the coil 126 of the first conductive pattern 118. The establishment of the link through the dielectric effectively connects the inductance and capacitance in parallel thereby completing the resonant circuit. The frequency of the resonant circuit can be determined utilizing suitable test equipment well known to those of ordinary skill in the art. If the resonant frequency of the tag 110 corresponds to the predetermined or desired resonant frequency, within a predetermined tolerance, then no further action need be taken. If the frequency of the resonant circuit does not correspond to the predetermined resonant frequency, then the capacitance of the resonant circuit must be adjusted either upwardly or downwardly. Since it may be difficult if not impossible to effectively remove the second conductive pattern 120 from the first conductive pattern 118, the position of the second conductive pattern 120 may be adjusted accordingly for a subsequent tag 110 being produced during a manufacturing process. Eventually, by carefully adjusting the position of the second conductive pattern 120 on the first conductive pattern 118 of subsequently produced tags, the resonant frequency of such subsequently produced tags may be adjusted upwardly or downwardly until the resonant frequency is at the predetermined frequency within the prescribed tolerance. In this manner, the resonant frequency of a tag 110 may be "tuned" to match the predetermined desired resonant frequency.

Figure 5:
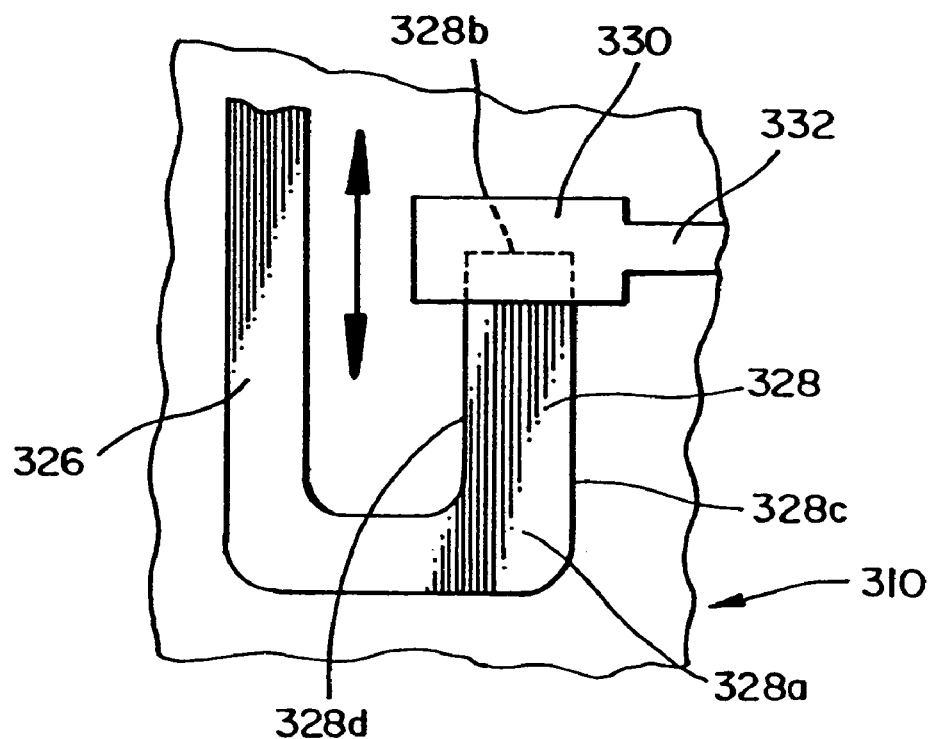
FIG. 5 is a fragmentary view of a portion of an alternative embodiment.

FIG. 5 is a fragmentary view of a portion of a tag 310 in accordance with an alternate embodiment of the present invention. The tag 310 includes a first conductive pattern which includes an inductive element or inductor coil 326 with a land 328 connected to the distal end of the coil 326. However, unlike the land 128 as described above in connection with FIG. 3, the land 328 in connection with the present embodiment is generally rectangularly shaped. More particularly, the land 328 in connection with the present embodiment includes a first end 328a which is generally parallel and spaced apart from a second end 328b. The land 328 further includes generally parallel lateral sides 328c and 328d. Thus, unlike the land 128 as shown in FIG. 3, the width of land 328 does not change when moving along the length of land 328 between ends 328a and 328b.

The present embodiment further includes a second conductive pattern 320 which is precisely the same as the second conductive pattern 120 as shown in FIG. 3. In particular, and as shown in FIG. 5, the second conductive pattern 320 includes a generally rectangularly shaped land 330, the first end of which is electrically connected to a generally elongated conductive link 332. As with the embodiment described above in connection with FIG. 3, the capacitance of the resonant frequency tag 310 is established by the degree to which the land 330 of the second conductive pattern overlies the land 328 of the first conductive pattern with the dielectric therebetween. FIG. 5 illustrates a situation in which a portion (approximately one half) of the width of land 330 overlies land 328 to provide a certain capacitance. In order to decrease the value of the capacitance, land 338 may be moved further away from the first end 328a of land 328 to thereby decrease the area in which land 330 overlies land 328. In order to increase the capacitance, land 330 may be moved toward the first end 328a of land 328 to thereby increase the area by which land 330 overlies land 328.

Figure 4:
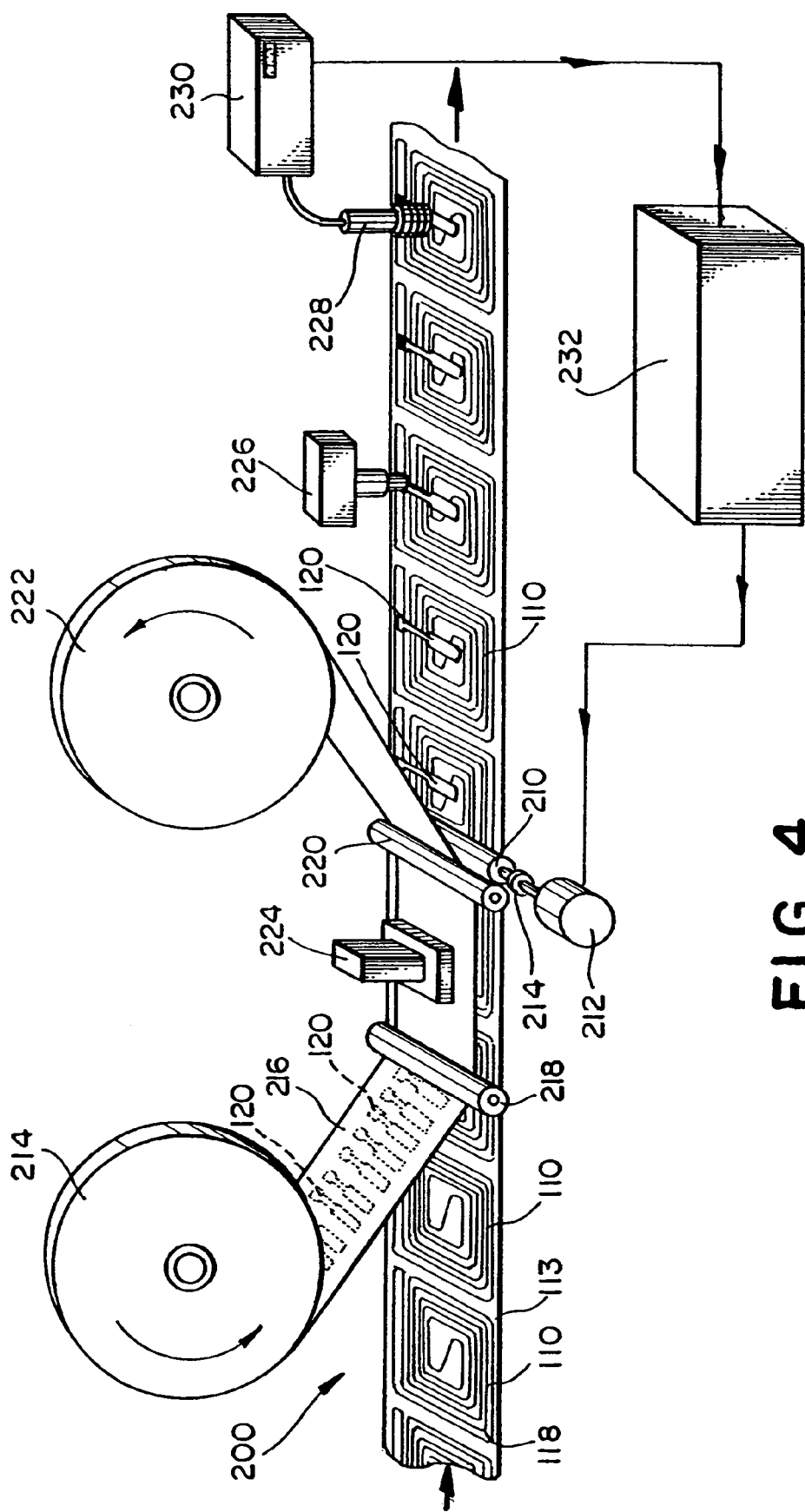
FIG. 4 is a schematic diagram illustrating a preferred manufacturing process for producing resonant frequency tags of the type illustrated in FIG. 3.

FIG. 4 illustrates a preferred system configuration for implementing a method of manufacturing resonant frequency tags in accordance with the present invention. The completed tags 110 are structurally the same as the tag 110 described above in connection with FIG. 3 and are secured together along opposite edges in a sequential series or web 200 for purposes of illustrating the present invention. In the web 200, which may be formed by a continuous carrier sheet 113, each of the partially completed tags 110 are oriented with the first conductive pattern 118 facing upwardly. As part of the manufacturing process, the web 200 of partially completed tags is moved from the left toward the right in a stepwise or indexed manner as illustrated by the flow arrows. Movement of the web 200 of partially completed tags is controlled by a drive roller 210 which is driven to index for a predetermined distance by a drive mechanism comprised of an electric motor 212 and suitable drive members 214. Other drive mechanisms may alternately be employed. In addition, in some applications, the second conductive pattern 120 may be applied to the first conductive pattern 118 after the partially completed tag 110 has been applied to an associated product. For example, it is known in the art that some items, particularly items with a high metal content, may change the frequency of an applied resonant frequency tag. By applying a partially completed tag 110 to the item and thereafter applying the second conductive pattern 120, any frequency shift caused by the item to which the tag 110 is attached can be compensated for by adjusting the position of the second conductive pattern 120 to adjust the resonant frequency of the completed tag 110 to be at the predetermined, desired frequency.

A first supply roll 214 includes a plurality of previously formed second conductive patterns 120 which are spaced apart a predetermined distance on the downwardly facing side of a supporting substrate such as release paper 216. The second conductive patterns 120, which may include a dielectric layer with heat seal properties, are positioned on the release paper 216 such that as the release paper 216 is removed from the supply roll 214, the second conductive patterns 120 are aligned with the first conductive patterns 118 of the web 200 in the manner described above in connection with the tag of FIG. 3. A pair of idler rollers 218, 220 and a take up roll 222 assist in establishing the proper orientation of the second conductive patterns 120 with respect to the first conductive patterns 118 of the partially completed tags of the web 200. A pressing mechanism 224, of a type well known to those skilled in the art, is positioned between the two idler rollers 218, 220 for pressing one of the second conductive patterns 120 into engagement with each of the partially completed tags 110 of the web 200. The pressing mechanism 224 may employ pressure, heat or a combination of heat and pressure for securing or bonding the second conductive patterns 120 to the first conductive patterns 118 of the partially completed tags 110.

As shown, once the tags of the web 200 pass beyond the second idler roller 220, each completed tag 110 of the web 200 includes a second conductive pattern 120 which has been secured so that at least a portion of the second land 130 of the second conductive pattern 120 overlies a portion of the first land 128 of the first conductive pattern 118 to establish a capacitance for the resonant circuit as described above. As the web 200 of completed tags 110 moves further toward the right, each of the tags passes through a welding mechanism 226 which creates the link which passes through the dielectric to electrically connect together the inductive portion 126 of the first conductive pattern 118 and the land 134 of the second conductive pattern 120 to thereby complete the resonant circuit. The welding mechanism 226 is of a type well known to those of ordinary skill in the art. Yet further along the production line, the resonant frequency of each of the tags 110 of the web 200 is measured utilizing a suitable probe 228 and frequency determining equipment 230 which are both also of a type well known to those of ordinary skill in the art. In effect, the probe 228 sequentially subjects each resonant frequency tag of the web 200 to a series of frequencies which are close to (above and below) the predetermined resonant frequency and then "listens" to see whether the tag 110 resonates at a particular frequency in a pulse/listen manner which is well known in the art. Once the precise frequency of each resonant frequency tag 110 is determined, the frequency information is sent from the frequency determining equipment 230 to a controller 232 which compares the resonant frequency as measured for each tag 110 with the desired or predetermined resonant frequency. If the resonant frequency of the tag 110 matches the predetermined resonant frequency within a prescribed small tolerance (for example, 100 KHz), then the manufacturing process is permitted to continue in the same manner with the subsequent second conductive patterns 120 being secured to succeeding tags 110 in the same position as the prior tag to maintain the same capacitance and thus the same frequency. On the other hand, if the controller 232 determines that the measured resonant frequency does not match the predetermined frequency within the prescribed tolerance, then the position of the second conductive pattern 120 on subsequent tags is adjusted to either increase the capacitance or decreased the capacitance of subsequent tags 110 depending upon the result of the comparison. In the embodiment as illustrated in FIG. 4, the position of the second conductive pattern 120 may be adjusted by adjusting the indexing of the web 200 by increasing or decreasing the time of the actuation of the electric motor 212 to thereby change the location of the first conductive pattern 118 of each partially completed tag 110 relative to the pressing mechanism 224 and second conductive pattern 120. Decreasing the time of the actuation of the electric motor 212 effectively moves the position of the second conductive pattern 120 to be closer to the second end 228b of conductive land 128 of the tags 110 to thereby decrease the capacitance of the resulting resonant circuit. Increasing the time of the actuation of the electric motor 212 effectively moves the position of the second conductive pattern 120 toward the first end 128a of conductive land 128 to effectively increase the capacitance of the resulting resonant circuit. By utilizing the above-described process, the position of the second conductive pattern 220 will promptly be in the correct location for subsequent tags 110 along the web 200 so that the frequency of subsequently produced tags 110 will continue to match the predetermined resonant frequency within the prescribed tolerance.

Figure 7:
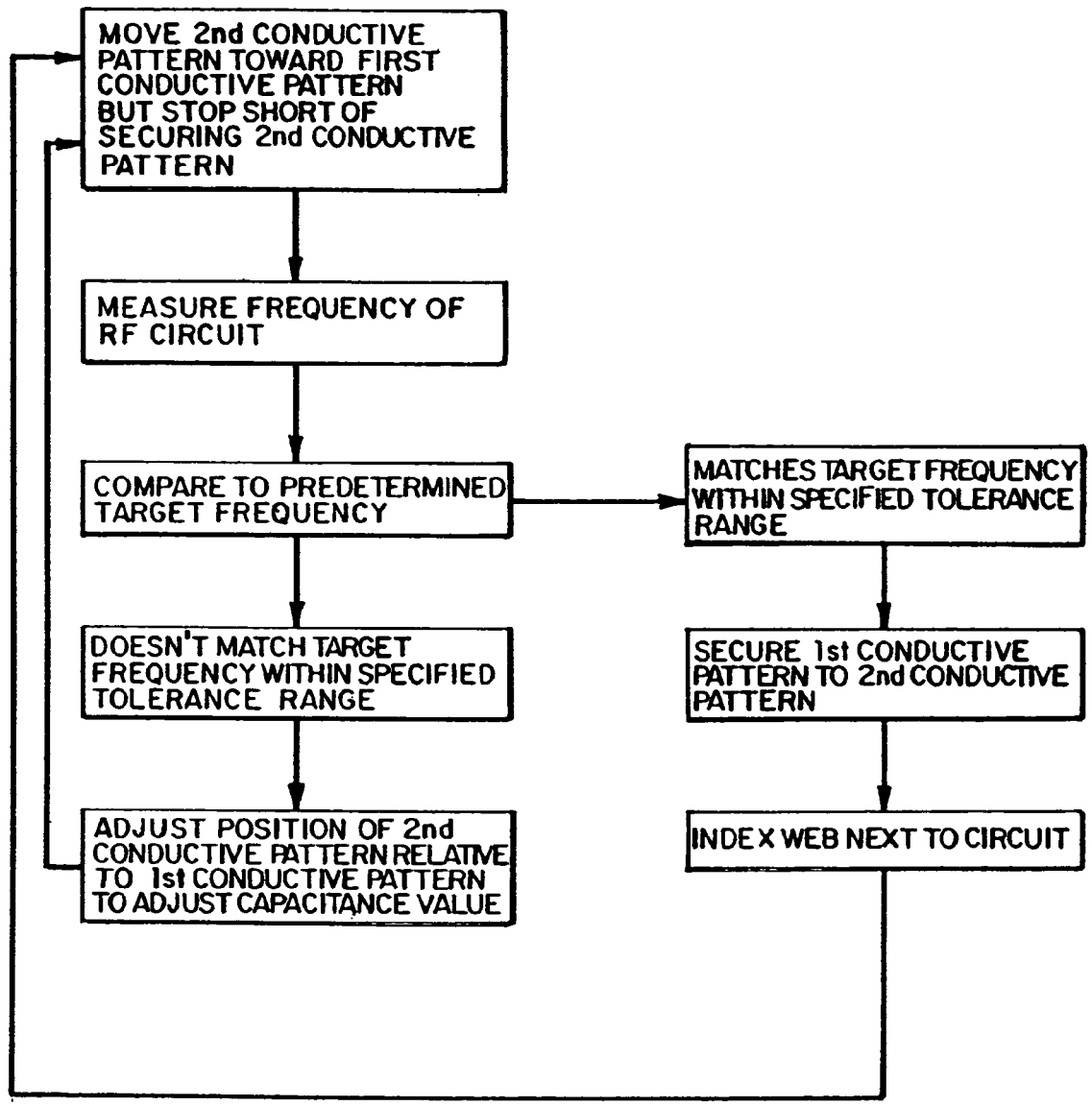
FIG. 7 is a flow diagram illustrating a method of adjusting the frequency of a resonant frequency tag made in accordance with the present invention.
Figure 8:
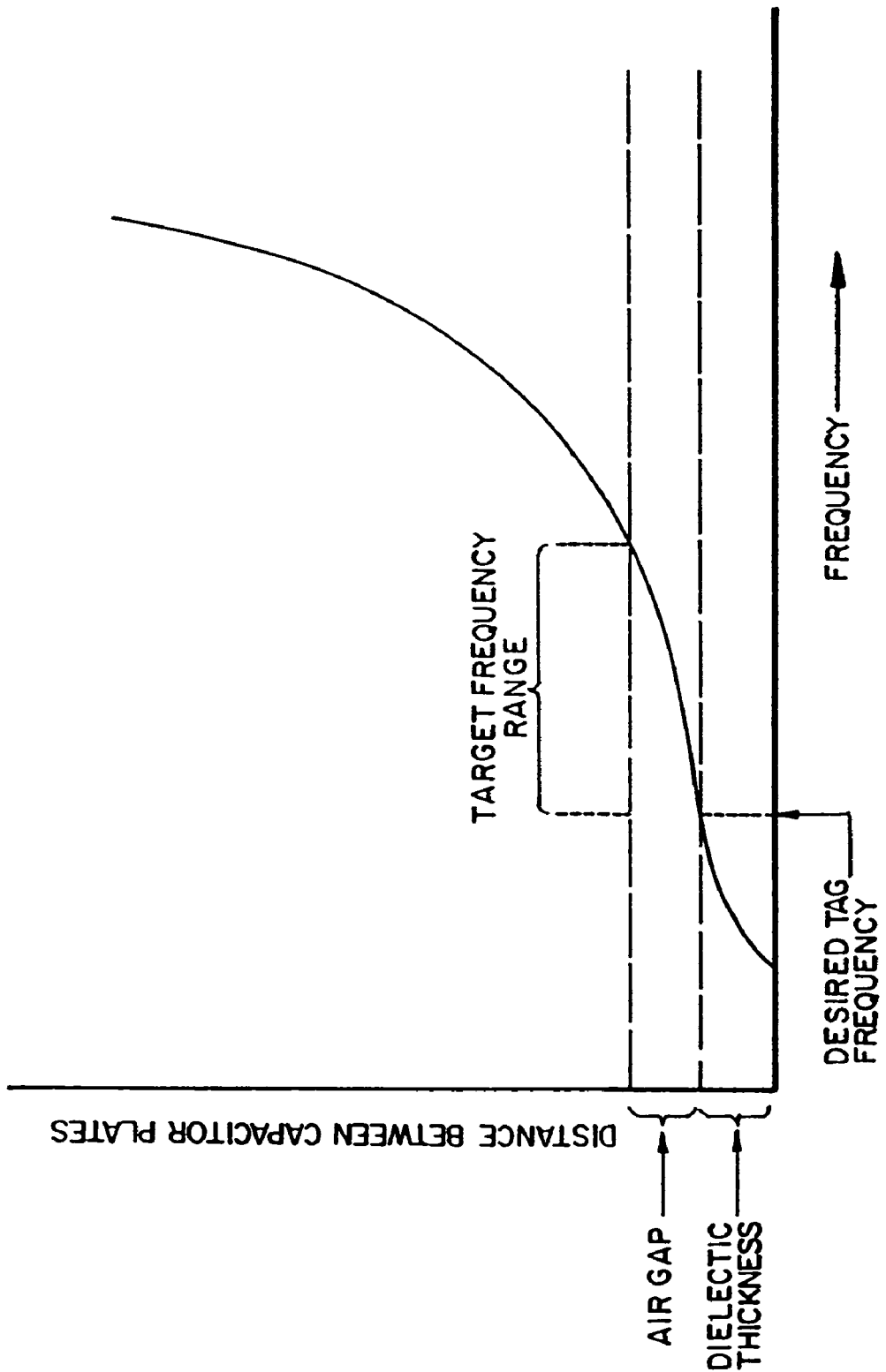
FIG. 8 is a diagram illustrating the change in frequency of a resonant frequency circuit as a function of the thickness of the dielectric between the capacitor plates.

It should be understood by those of ordinary skill in the art that the manufacturing process disclosed in FIG. 4 is but one embodiment implementing the present invention. If desired, the frequency measuring station 228, 230 could be located prior to the welding mechanism 226 or could be integrated as part of the pressing mechanism 224. For example, the pressing mechanism 224 could include non-metallic plates (not shown) for engaging and pressing together the first conductive pattern 118 and second conductive pattern 120 with a probe that measures the frequency of a tag 110 as the second conductive pattern 120 and the first conductive pattern 118 are being pressed together but before the second conductive pattern 120 is actually secured to the first conductive pattern 118. While the frequency reading thus obtained will not be the same as it would for a completed tag 110, a relationship exists between the read frequency and the final frequency of the completed tag 110 which enables an adjustment to be made to the position of the second conductive pattern 120 in order to have the completed tag 110 resonate at the desired frequency. Suitable feedback may be provided to control the position of the second conductive pattern 120. This method is illustrated by the flow diagram of FIG. 7 and the diagram of FIG. 8. Referring to FIG. 8, it can be seen that a measured frequency within the target range when the second conductive pattern 120 is separated from the first conductive pattern 118 by the dielectric thickness and an additional air gap, results in a completed tag (i.e., with the second conductive pattern 120 engaging the dielectric) with a frequency which corresponds to the desired frequency within the prescribed tolerance.

As can be appreciated from FIG. 8, the capacitance of a tag may also be changed, at least slightly, by varying the pressure applied by the pressing mechanism 224. For example, applying additional pressure effectively decreases the separation between the capacitor plates to thereby increase capacitance and decreasing the pressure effectively increases the distance between the capacitor plates to decrease capacitance. Control of the pressure applied by the pressing mechanism 224 may be accomplished by the controller 232 based upon the frequency reading obtained by the frequency measuring station 228, 230. Alternatively, the pressing mechanism 224 could include its own frequency measuring equipment to provide for immediate feedback for real time controlling of the pressure applied by the pressing mechanism 224. Other techniques or equipment for controlling the amount of pressure applied to the second conductive pattern 120 will be apparent to those of ordinary skill in the art. Controlling the pressure applied by the pressing mechanism 224 can thus be used as a way of fine tuning the resonant frequency of each tag. Other variations in the manufacturing process will be apparent those of ordinary skill in the art.

In addition to providing a method for making resonant frequency tags which resonate at a predetermined frequency or within a small tolerance of a predetermined frequency, the present invention comprises a method of making a series of individually unique resonant frequency tags, each of which resonates at a different frequency within a frequency range. As can clearly be understood by the foregoing description, the frequency of a resonant frequency tag is an inverse function of the capacitance and the inductance of the tag and is established by the formula set forth above. As also described above, in the resonant frequency tag shown on FIG. 3, the inductance is constant and is determined by the size and other characteristics of the inductive coil 126 of the first conductive pattern 118. The frequency of the tag 110 of FIG. 3 is thus determined by the capacitance of the tag which is established by the location of the second conductive pattern 120 and, more particularly, the portion of the conductive land 128 which is overlaid by the conductive land 130 to establish the capacitance of the capacitive element. The more the second conductive pattern 120 and, particularly conductive land 130 moves toward the first end 128a of the first conductive land 128, the greater the capacitance of the resonant frequency circuit and, thus, the lower the frequency and vice versa.

In some applications, rather than having a series of resonant frequency tags which all resonant at the same or at nearly the same frequency, it is desirable to have a series of resonant frequency tags, each of which resonates at a frequency which is different from the resonant frequency of every other tag in the series. Such a series of tags, all having different frequencies, can be useful in radio frequency identification (RFID) by associating a resonant frequency tag having a particular known frequency with a particular item. Thus, by detecting a tag having a particular resonant frequency, the presence of the item associated with the tag having the particular frequency may also be detected.

In accordance with the present invention, a series of N resonant frequency tags (N being an integer greater than 1) may be made by merely varying the position of the second conductive pattern 130 on each tag as described above. Thus, for example, a first resonant frequency tag having a first resonant frequency may be established by locating the second conductive pattern 130 proximate to the first end 128a of the conductive land 128, a second resonant frequency tag having a second resonant frequency may be made by positioning the second conductive pattern 130 a little bit closer to the second end 128b of the first conductive land, etc. By moving the second conductive pattern 130 by only a small distance along the length of the first conductive land 128 an entire series of N resonant frequency tags may be made. For example, by employing the above-described techniques it is possible to make a series of about 2,800 resonant frequency tags within the frequency range of 2 to 30 MHz with the resonant frequency of each tag of the series differing from the resonant frequency of each of the other resonant frequency tags of the series by a frequency range of at least 10 kHz.

Making a series of resonant frequency tags with each tag having a different resonant frequency may be accomplished in the same manner and using the same techniques as described above in connection with FIG. 4. However, unlike FIG. 4 in which the described goal is to produce tags having the same frequency, the equipment disclosed and described is operated to create resonant frequency tags having different frequencies by adjusting the time of actuation of the electric motor 212 to change the position of the placement of the second conductive patterns 120 relative to the first conductive patter 118 for each tag accordingly.

Figure 6:
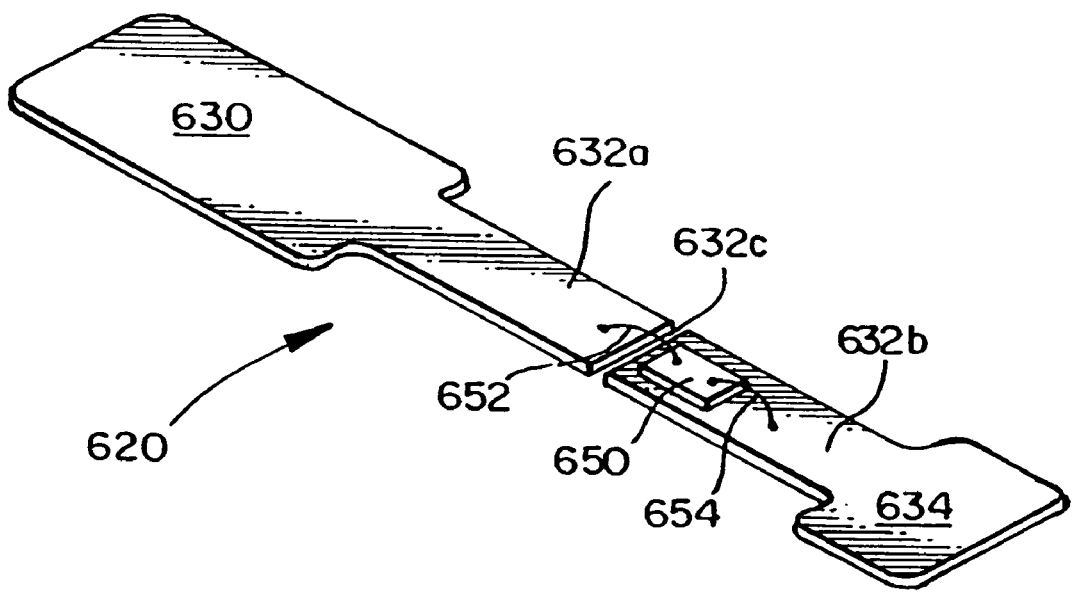
FIG. 6 is an enlarged perspective view of a second conductive pattern which includes an integrated circuit in accordance with another embodiment of the present invention.

FIG. 6 is a perspective view of a second conductive pattern 620 in accordance with a further embodiment of the present invention. The second conductive pattern 620 is essentially the same as the second conductive pattern 120 as described above and shown in connection with FIGS. 3 and 4. In particular, the second conductive pattern 620 includes a generally rectangularly shaped second conductive land 630 the first end of which is connected to a generally elongated conductive link formed of two sections 632a and 632b which are spaced apart by a gap 632c of a predetermined minimum width. The second section 632b of the conductive link in turn is connected to a further generally rectangular conductive land 634. The second conductive pattern 620 may be formed using a subtractive or etching process, an additive process such as conductive ink, a die cut process or in any other manner which is known or becomes known to those of ordinary skill in the art. The second conductive pattern 620 may include a dielectric layer.

The second conductive pattern 620 further includes an integrated circuit 650 which is preferably secured to one of the first and second sections 632a, 632b of the link element. The integrated circuit 650 which is of a type well known to those of ordinary skill in the art includes at least two electrical leads with a first electrical lead 652 being electrically connected to the first link element section 632a and the second lead 654 being electrically connected to the second link element section 632b. By incorporating an integrated circuit 650 in this manner, a resonant frequency tag made in accordance with any of the above-described methods may be employed as a radio frequency identification (RFID) tag of the type which includes a memory chip for storing identification information. The resonant circuit thus acts as an antenna and power source for the integrated circuit 650 for radiating a radio frequency signal determined by the data stored within the memory of the integrated circuit.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method of making a resonant frequency tag which resonates at a desired frequency, the method comprising the steps of:
  (a) forming a first conductive pattern comprising an inductive element and a first land, the first land having a first end connected to one end of the inductive element, and a second end spaced a predetermined distance from the first end;
  (b) separately forming a second conductive pattern comprising a second land and a link element, the second land having a predetermined width;
  (c) placing the second conductive pattern proximate to the first conductive pattern at a first predetermined location so that the second land overlies at least a portion of the first land with a dielectric therebetween to establish the plates of a capacitive element with a predetermined capacitance which with the inductive element forms a resonant circuit;
  (d) measuring a resonant frequency of the resonant circuit and comparing the measured frequency with the desired frequency; and
  (e) if the resonant frequency does not match the desired frequency within a selected tolerance, moving the second conductive pattern so that the second land moves along a length of the first land to thereby change the capacitance of the capacitive element, whereas if the resonant frequency does match the desired frequency, securing the second conductive pattern to the first conductive pattern.

2. The method of claim 1 further comprising the steps of:
  (f) repeating steps (d) and (e) until a match occurs; and
  (g) securing the second conductive pattern to the first conductive pattern.

3. The method as recited in claim 2, wherein the first land has a width which decreases when moving along the length from one end to the other end.

4. The method as recited in claim 3, wherein the second land is generally rectangular and has a length which exceeds the greatest width of the first land.

5. The method as recited in claim 2, wherein the second conductive pattern is secured to the first conductive pattern by one of an adhesive and hot pressing.

6. The method as recited in claim 5, wherein the second conductive pattern is secured to the first conductive pattern by applying pressure, the amount of applied pressure being varied to control the resonant frequency of the tag.

7. The method as recited in claim 2, wherein the second conductive pattern, once formed, is initially held on a carrier sheet.

8. The method as recited in claim 2, wherein the second conductive pattern includes the dielectric layer which is placed between the second land and the first land prior to securing the second conductive pattern to the first conductive pattern.

9. The method as recited in claim 2, wherein the link element comprises a first section connected to the second land and a second section, the first and second sections of the link element being spaced apart by a gap of a predetermined minimum width further comprising an integrated circuit including at least a first lead electrically connected to the first section of the link element and a second lead electrically connected to the second section of the link element.

10. The method as recited in claim 9, wherein the integrated circuit is secured to one of the first and second section of the link element.

11. The method as recited in claim 1, wherein the first land has a width which decreases when moving along the length from one end to the other end.

12. The method as recited in claim 11, wherein the second land is generally rectangular and has a length which exceeds the greatest width of the first land.

13. The method as recited in claim 1, wherein the second conductive pattern is secured to the first conductive pattern by one of an adhesive and hot pressing.

14. The method as recited in claim 13, wherein the second conductive pattern is secured to the first conductive pattern by applying pressure, the amount of applied pressure being varied to control the resonant frequency of the tag.

15. The method as recited in claim 1, wherein the second conductive pattern, once formed, is initially held on a carrier sheet.

16. The method as recited in claim 1, wherein the second conductive pattern includes a the dielectric layer which is placed between the second land and the first land prior to securing the second conductive pattern to the first conductive pattern.

17. The method as recited in claim 1, wherein the link element comprises a first section connected to the second land and a second section, the first and second sections of the link element being spaced apart by a gap of a predetermined minimum width further comprising an integrated circuit including at least a first lead electrically connected to the first section of the link element and a second lead electrically connected to the second section of the link element.

18. The method as recited in claim 17, wherein the integrated circuit is secured to one of the first and second section of the link element.

* * * * *